(12) United States Patent
Lee (10) Patent No.: US 8,664,051 B2
(45) Date of Patent: Mar. 4, 2014

(54) THIN-FILM TRANSISTOR AND MANUFACTURING METHOD THEREOF AND DISPLAY

(71) Applicant: Innocom Technology(Shenzhen) Co., Ltd., Shenzhen (CN)

(72) Inventor: Kuan-Feng Lee, Miao-Li County (TW)

(73) Assignees: Innocom Technology(Shenzhen) Co., Ltd., Longhua Town, Shenzhen (CN); Chimei Innolux Corporation, Miao-Li County (TW)

( * ) Notice: Subject to any disclaimer, the term of this patent is extended or adjusted under 35 U.S.C. 154(b) by 0 days.

(21) Appl. No.: 13/764,382

(22) Filed: Feb. 11, 2013

(65) Prior Publication Data

US 2013/0207103 A1    Aug. 15, 2013

(30) Foreign Application Priority Data

Feb. 14, 2012    (TW) ............................... 101104634 A (51) Int. Cl.
*H01L 29/786*    (2006.01)
(52) U.S. Cl.
USPC ............................................ 438/158; 257/43

(58) Field of Classification Search
USPC .............................................. 438/158; 257/43
See application file for complete search history.

(56) References Cited

U.S. PATENT DOCUMENTS 8,274,077 B2 *   9/2012   Akimoto et al. ................ 257/43

* cited by examiner

*Primary Examiner* — Matthew W Such
*Assistant Examiner* — Monica D Harrison
(74) *Attorney, Agent, or Firm* — McClure, Qualey & Rodack, LLP (57) ABSTRACT

An embodiment of the invention provides a manufacturing method of a thin-film transistor includes: providing a substrate; sequentially forming a gate electrode, a gate insulating layer, and an active layer on the substrate; forming an insulating metal oxide layer covering the active layer, wherein the insulating metal oxide layer including a metal oxide of a first metal; forming a metal layer covering the active layer, wherein the metal layer includes a second metal; forming a source electrode and a drain electrode on the metal layer with a trench separating therebetween; removing the metal layer exposed by the trench; and performing an annealing process to the metal layer and the insulating metal oxide layer, such that the metal layer reacts with the insulating metal oxide layer overlapping the metal layer to form a conducting composite metal oxide layer including the first metal and the second metal.

20 Claims, 13 Drawing Sheets

THIN-FILM TRANSISTOR AND MANUFACTURING METHOD THEREOF AND DISPLAY

CROSS REFERENCE TO RELATED APPLICATIONS

This application claims priority of Taiwan Patent Application No. 101104634, filed on Feb. 14, 2012, the entirety of which is incorporated by reference herein.

BACKGROUND OF THE INVENTION

1. Field of the Invention

The present invention relates to a thin-film transistor, and in particular relates to a bottom gate thin-film transistor.

2. Description of the Related Art

With the progress of display technology, daily life is getting more convenient with the assistance of display devices. With demands of being light and thin, flat panel displays (FPD) have now become the most popular type of displays. Among the variety of FPDs, liquid crystal displays (LCDs) are highly praised by consumers because of advantages such as efficient space utilization, low power consumption, no radiation, and low electromagnetic interference (EMI).

Liquid crystal displays are mainly composed of an active array substrate, a color filter substrate, and a liquid crystal layer located therebetween. The active array substrate has an active region and a periphery circuit region. The active arrays are located in the active region, and the driving circuits having a plurality of bottom gate thin-film transistors are located in the periphery circuit region.

In the related art, the manufacturing process of the bottom gate thin-film transistor easily suffers from some problems. For example, the forming of a source electrode and a drain electrode may easily damage an active layer therebelow, which results in back channel damage.

BRIEF SUMMARY OF THE INVENTION

An embodiment of the invention provides a manufacturing method of a thin-film transistor which includes: providing a substrate; forming a gate electrode and a gate insulating layer covering the gate electrode on the substrate; forming an active layer on the gate insulating layer, wherein the active layer is above the gate electrode; forming an insulating metal oxide layer covering the active layer on the gate insulating layer, wherein the insulating metal oxide layer comprises a metal oxide of a first metal; forming a metal layer covering the active layer on the insulating metal oxide layer, wherein the metal layer comprises a second metal different from the first metal; forming a source electrode and a drain electrode on the metal layer, wherein the source electrode and the drain electrode above the active layer are separated from each other by a trench to be respectively located at two opposite sides of the gate electrode, wherein the trench exposes a portion of the metal layer; removing the portion of the metal layer exposed by the trench to expose the insulating metal oxide layer by the trench; and performing an annealing process to the metal layer and the insulating metal oxide layer, such that the metal layer reacts with the insulating metal oxide layer overlapping the metal layer to form a conducting composite metal oxide layer comprising the first metal and the second metal, wherein the conducting composite metal oxide layer connects the active layer and the source electrode, and connects the active layer and the drain electrode.

An embodiment of the invention provides a manufacturing method of a thin-film transistor, which includes: providing a substrate; forming a gate electrode and a gate insulating layer covering the gate electrode on the substrate; forming an active layer on the gate insulating layer, wherein the active layer is above the gate electrode; forming an insulating metal oxide layer covering the active layer on the gate insulating layer, wherein the insulating metal oxide layer comprises a metal oxide of a first metal; forming a mask layer on the insulating metal oxide layer, wherein the mask layer has a first opening and a second opening respectively exposing a first portion and a second portion of the insulating metal oxide layer, and the first portion and the second portion are respectively above two opposite sides of the gate electrode; performing an annealing process to reduce the first portion and the second portion to a first conductive portion and a second conductive portion respectively, wherein the first conductive portion and the second conductive portion comprise a metal or a conductive metal oxide material with a lower oxygen content than that of the insulating metal oxide layer; removing the mask layer; and forming a source electrode and a drain electrode on the first conductive portion and the second conductive portion, respectively.

An embodiment of the invention provides a thin-film transistor, which includes: a substrate; a gate electrode on the substrate; a gate insulating layer on the substrate and covering the gate electrode; an active layer on the gate insulating layer and above the gate electrode; a protective conducting layer on the active layer, wherein the protective conducting layer has a first conductive portion and a second conductive portion on the opposite sides of the gate electrode respectively, a trench separates the first conductive portion from the second conductive portion, and the protective conducting layer is a metal layer comprising a first metal, a metal oxide layer comprising the first metal, or a conducting composite metal oxide layer comprising the first metal and a second metal different from the first metal; an insulating metal oxide layer on the active layer and in the trench to electrically insulate the first conductive portion from the second conductive portion, wherein the insulating metal oxide layer is a metal oxide layer comprising the first metal; and a source electrode and a drain electrode on the first conductive portion and the second conductive portion, respectively.

An embodiment of the invention provides a display, which includes: a thin-film transistor substrate having a plurality of thin-film transistors as described above; a substrate opposite to the thin-film transistor substrate; and a display medium between the thin-film transistor substrate and the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
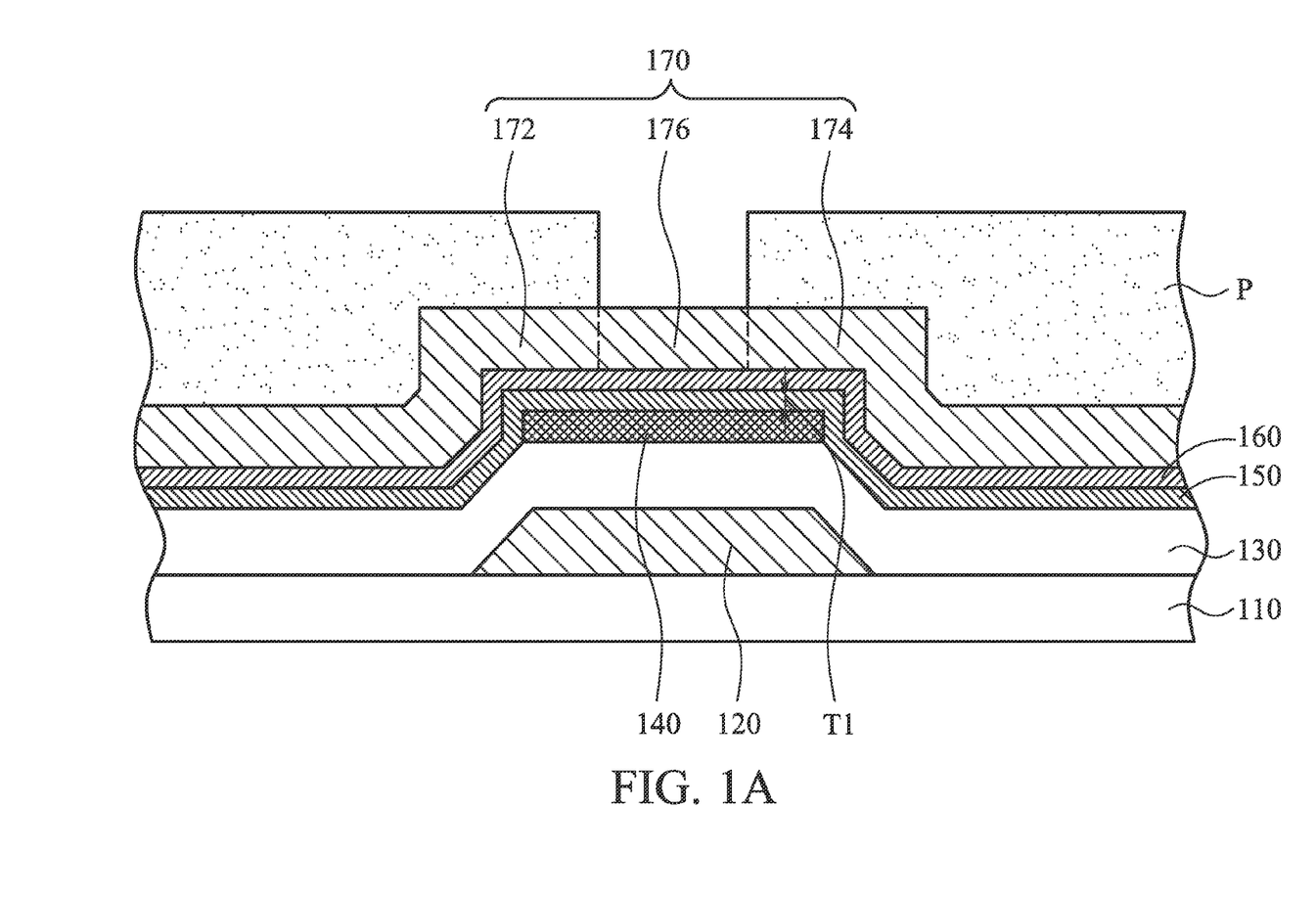
FIGS. 1A-1D are cross-sectional views of a manufacturing process of a thin-film transistor according to an embodiment of the present invention.

FIGS. 1A-1D are cross-sectional views of a manufacturing process of a thin-film transistor according to an embodiment of the present invention. Referring to FIG. 1A, a substrate 110 is provided, and the substrate 110 is, for example, a glass substrate. Then, a gate electrode 120 and a gate insulating layer 130 covering the gate electrode 120 are formed on the substrate 110. In one embodiment, the gate electrode 120 may include aluminum (Al), molybdenum (Mo), or other suitable conductive materials. The gate insulating layer 130 may include, for example, silicon dioxides, or other dielectric materials with a high dielectricity.

Then, an active layer 140 is formed on the gate insulating layer 130, wherein the active layer 140 is above the gate electrode 120. The active layer 140 includes, for example, indium-gallium-zinc-oxide (IGZO), or other semiconductor materials suitable for use as the active layer.

Then, an insulating metal oxide layer 150 covering the active layer 140 is formed on the gate insulating layer 130, wherein the insulating metal oxide layer 150 includes a metal oxide material of a first metal, such as aluminum oxide. The forming of the insulating metal oxide layer 150 includes, for example, providing oxygen in a metal sputtering process to directly deposit the metal oxide material on the active layer 140. The thickness T1 of the insulating metal oxide layer 150 is, for example, 100 Å to 300 Å. In one embodiment, the thickness T1 of the insulating metal oxide layer 150 is about 150 Å to 250 Å.

Then, a metal layer 160 covering the active layer 140 is formed on the insulating metal oxide layer 150, wherein the metal layer 160 includes a second metal different from the first metal. The metal layer 160 includes titanium or other suitable metal materials.

Then, a protective conducting layer 170 is optionally formed on the metal layer 160, and includes a source electrode 172, a drain electrode 174, and a separating portion 176 separating therebetween on the active layer 140, wherein the source electrode 172 and the drain electrode 174 are located at two opposite sides of the gate electrode 120 respectively. The protective conducting layer 170 may include aluminum (Al), molybdenum (Mo), titanium (Ti), copper (Cu), or other suitable conducting materials. In the present embodiment, the protective conducting layer 170 may include aluminum and molybdenum. Then, a photoresist layer P is formed on the protective conducting layer 170 to cover the source electrode 172 and the drain electrode 174, and expose the separating portion 176.

Figure 1B:
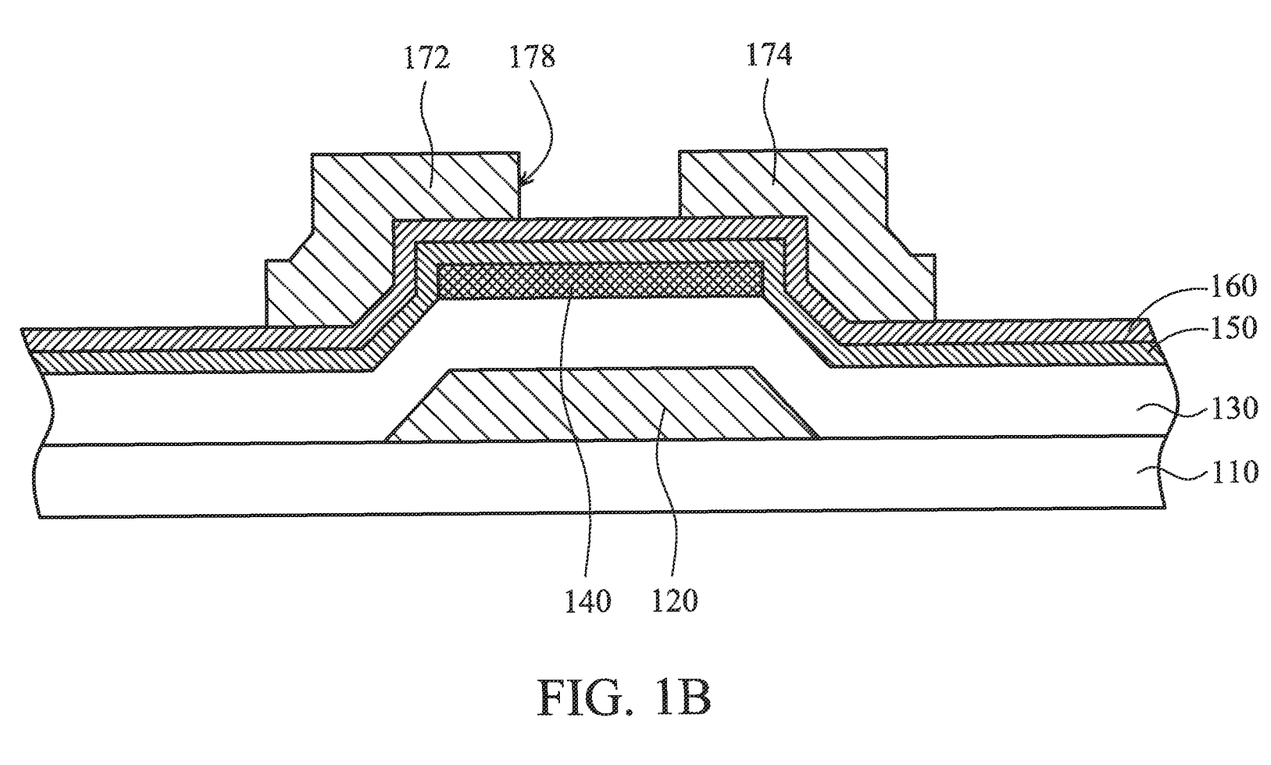

Referring to FIGS. 1A and 1B, a wet etching process is performed by using the photoresist layer P as a mask to remove the separating portion 176 and expose a portion of the metal layer 160. Specifically, a trench 178 between the source electrode 172 and the drain electrode 174 is formed after removing the separating portion 176, and the trench 178 exposes a portion of the metal layer 160. In one embodiment, the metal layer 160 is a titanium layer. Since it is not easy to etch titanium during the wet etching process, the metal layer 160 may be used as an etching stop layer in the wet etching process.

Figure 1C:
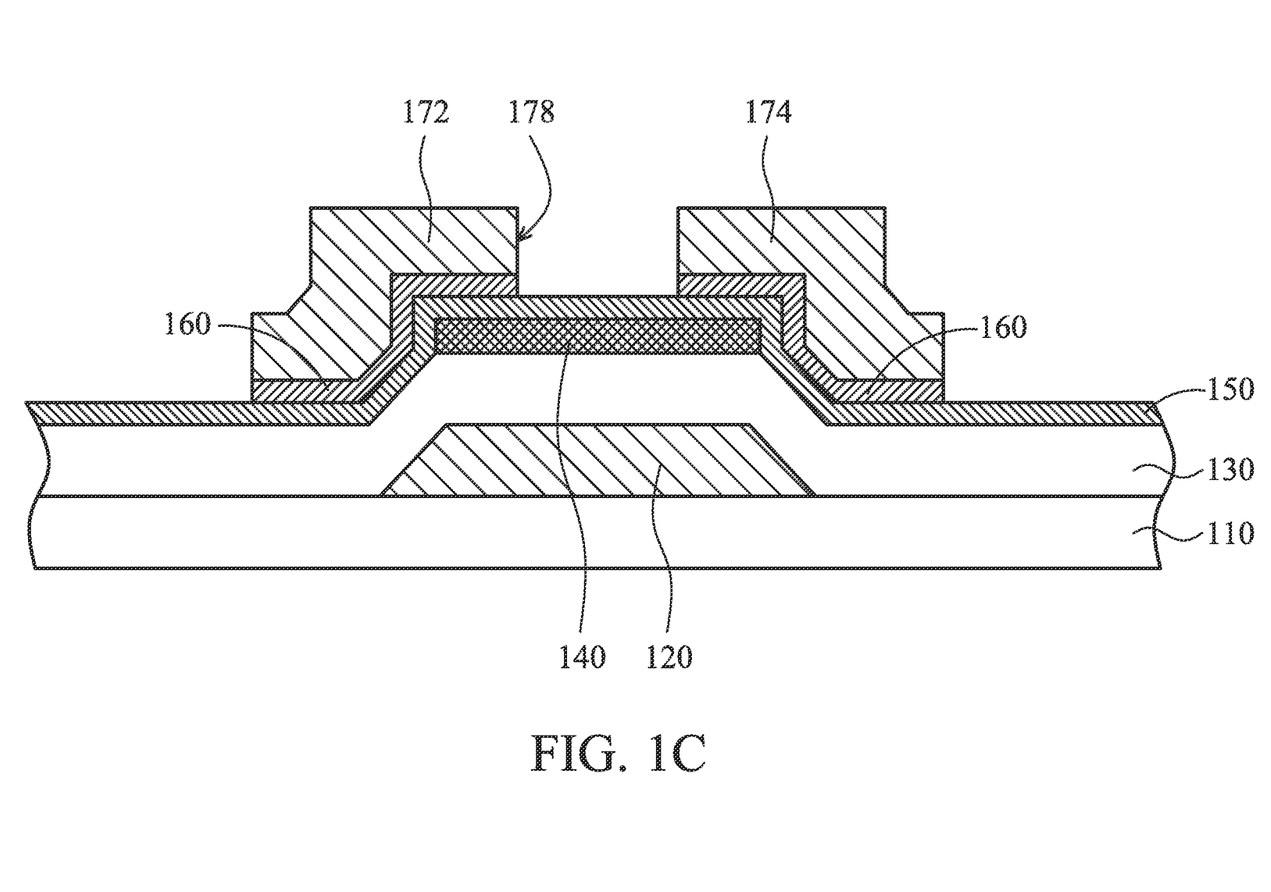

Referring to FIG. 1C, a dry etching process is optionally performed by using the source electrode 172 and the drain electrode 174 as a mask to remove the portion of the metal layer 160 exposed by the trench 178, which exposes a portion of the insulating metal oxide layer 150.

Figure 1D:
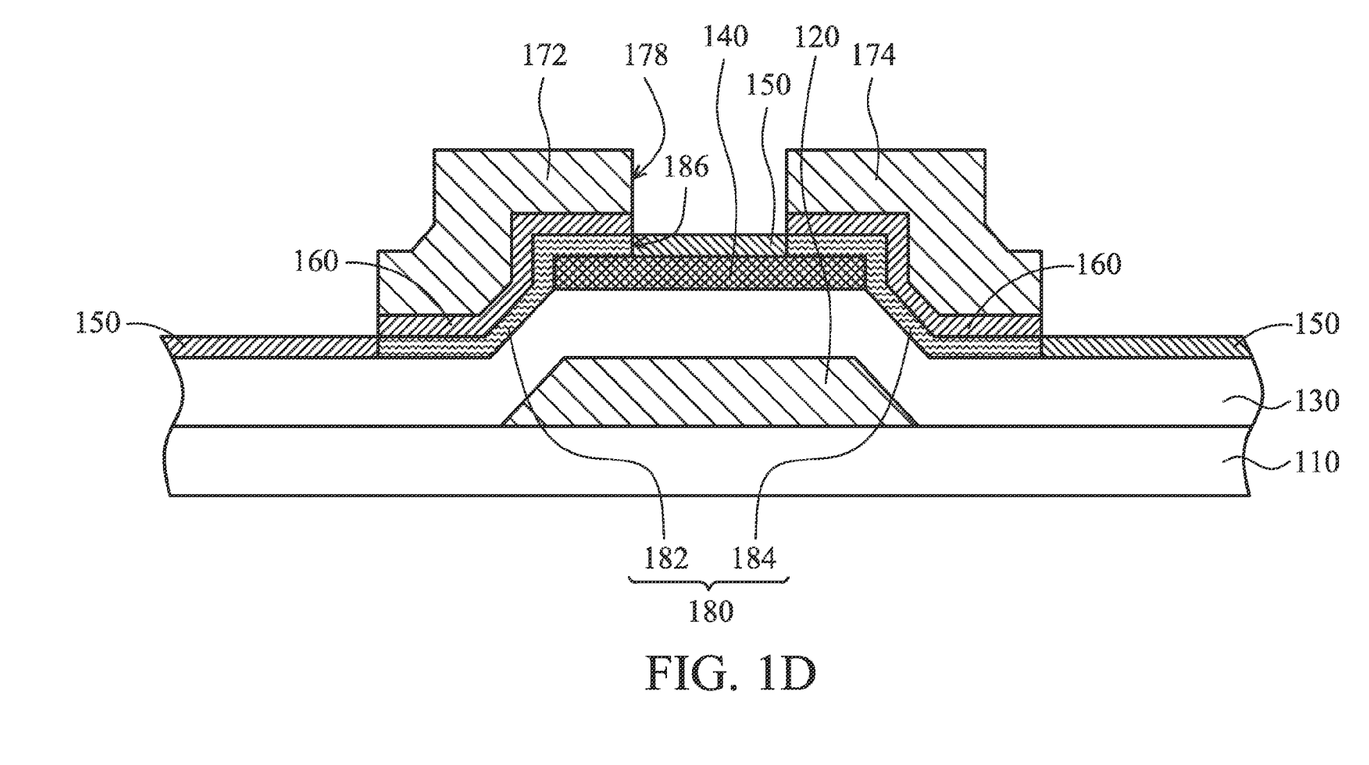

Referring to FIG. 1D, an annealing process is performed to the metal layer 160 and the insulating metal oxide layer 150, such that the metal layer 160 reacts with the insulating metal oxide layer 150 to form a conducting composite metal oxide layer 180. The processing temperature of the annealing process is, for example, about 300° C. to 700° C., and the processing time is, for example, longer than 30 minutes.

Specifically, since the conducting composite metal oxide layer 180 is formed from the reaction of the insulating metal oxide layer 150 including the first metal and the metal layer 160 including the second metal, the conducting composite metal oxide layer 180 is a conducting layer including the first metal and the second metal. In one embodiment, the first metal is aluminum, the insulating metal oxide layer 150 is an aluminum oxide ($Al_2O_3$) layer, the second metal is titanium, and the conducting composite metal oxide layer 180 is a titanium aluminum oxide ($TiAl_2O_5$) layer.

The conducting composite metal oxide layer 180 electrically connects the active layer 140 and the source electrode 172, and connects the active layer 140 and the drain electrode 174. Specifically, the conducting composite metal oxide layer 180 has a first conducting portion 182 and a second conducting portion 184 at the two opposite sides of the gate electrode 120 respectively. The first conducting portion 182 and the second conducting portion 184 are separated from each other by a trench 186, wherein the insulating metal oxide layer 150 is located in the trench 186 to electrically insulate the first conducting portion 182 from the second conducting portion 184. The source electrode 172 and the drain electrode 174 are located on the first conducting portion 182 and the second conducting portion 184, respectively. The metal layer 160 is between the first conducting portion 182 and the source electrode 172, and between the second conducting portion 184 and the drain electrode 174.

In one embodiment, the lengths of the source electrode 172 and the drain electrode 174 are substantially the same as that of the corresponding metal layer 160. Specifically, the length of the source electrode 172 is substantially the same as that of the portion of the metal layer 160 between the first conducting portion 182 and the source electrode 172. The length of the drain electrode 174 is substantially the same as that of the portion of the metal layer 160 between the second conducting portion 184 and the drain electrode 174. In one embodiment, the length of the active layer 140 is less than that of the gate electrode 120.

It should be noted that, since the conducting composite metal oxide layer 180 (such as titanium aluminum oxide) has an electrical conductivity similar to that of semiconductor materials, the contact resistance of the conducting composite metal oxide layer 180 can match that of the active layer 140 formed of the semiconductor materials, such that the conducting composite metal oxide layer 180 is suitable to electrically connect the active layer 140 and the source electrode 172 (or the drain electrode 174).

Figure 2:
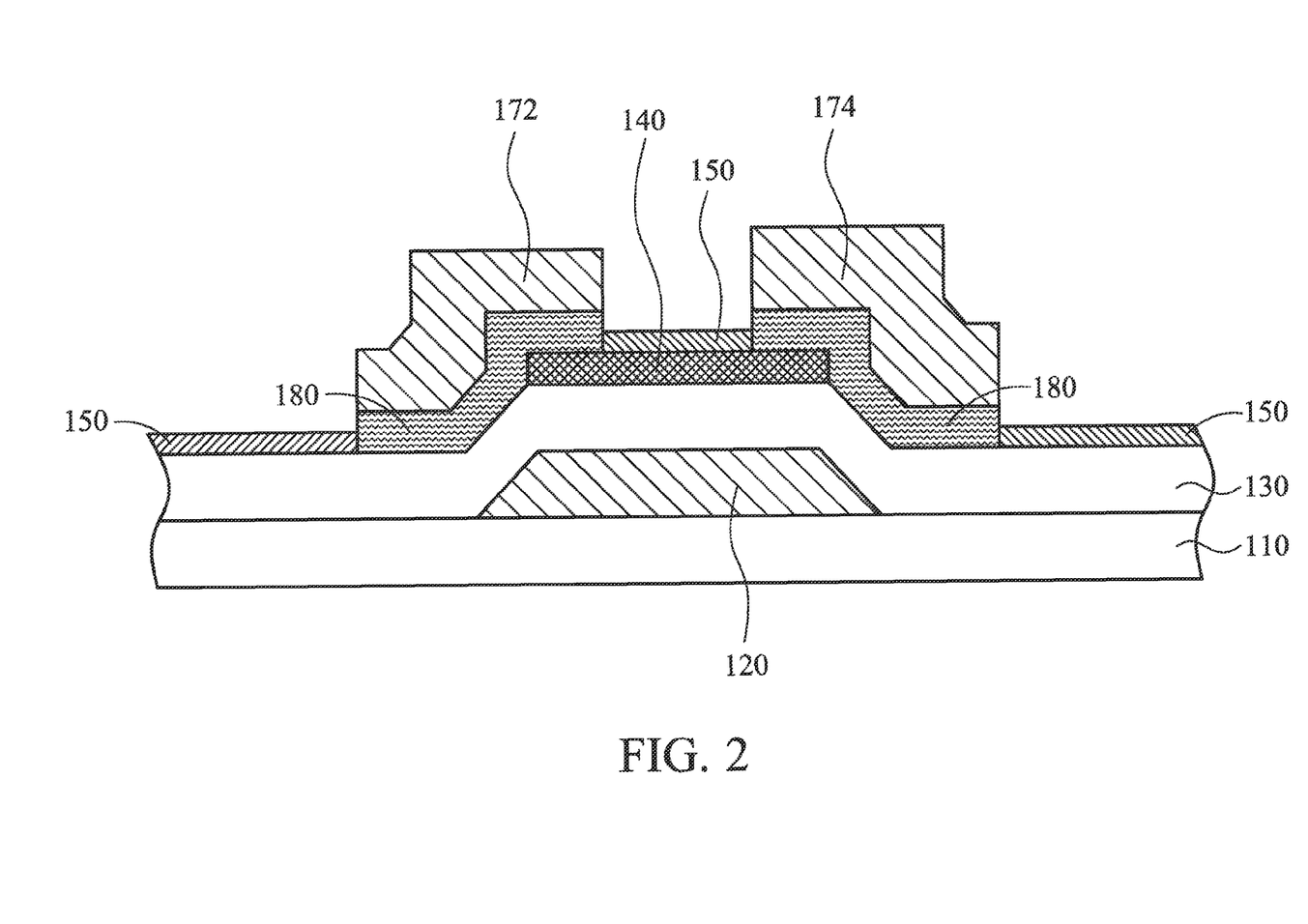
FIG. 2 is a cross-sectional view of a manufacturing process of a thin-film transistor according to another embodiment of the present invention.

Furthermore, the portion of the insulating metal oxide layer 150 neighboring the metal layer 160 must be fully reacted into the conducting composite metal oxide layer 180 to electrically connect the active layer 140 and the source electrode 172 (or the drain electrode 174), but the metal layer 160 does not have to be fully reacted into the conducting composite metal oxide layer 180. FIG. 1D shows the embodiment that the metal layer 160 is not fully reacted into the conducting composite metal oxide layer 180, but is not limited thereto. In another embodiment, as shown in FIG. 2, the metal layer 160 is fully reacted into the conducting composite metal oxide layer 180.

It can be understood from the above that, in the present embodiment, the metal layer 160 is used as an etching top layer during etching the separating portion 176 to protect the insulating metal oxide layer 150 and the active layer 140 therebelow. Therefore, the present embodiment may avoid the problems associated with the etching of the separating portion damaging the active layer therebelow. Furthermore, the insulating metal oxide layer 150 may be used as a protective layer during removal of the metal layer 160 to protect the active layer 140 below the insulating metal oxide layer 150. Then, by performing the annealing process, the portions of the insulating metal oxide layer 150 connecting the active layer 140 and the source electrode 172 and connecting the active layer 140 and the drain electrode 174 react with the metal layer 160 to form the conducting composite metal oxide layer 180, which electrically connects the active layer 140 with the source electrode 172 and electrically connects the active layer 140 with the drain electrode 174.

Figure 3A:
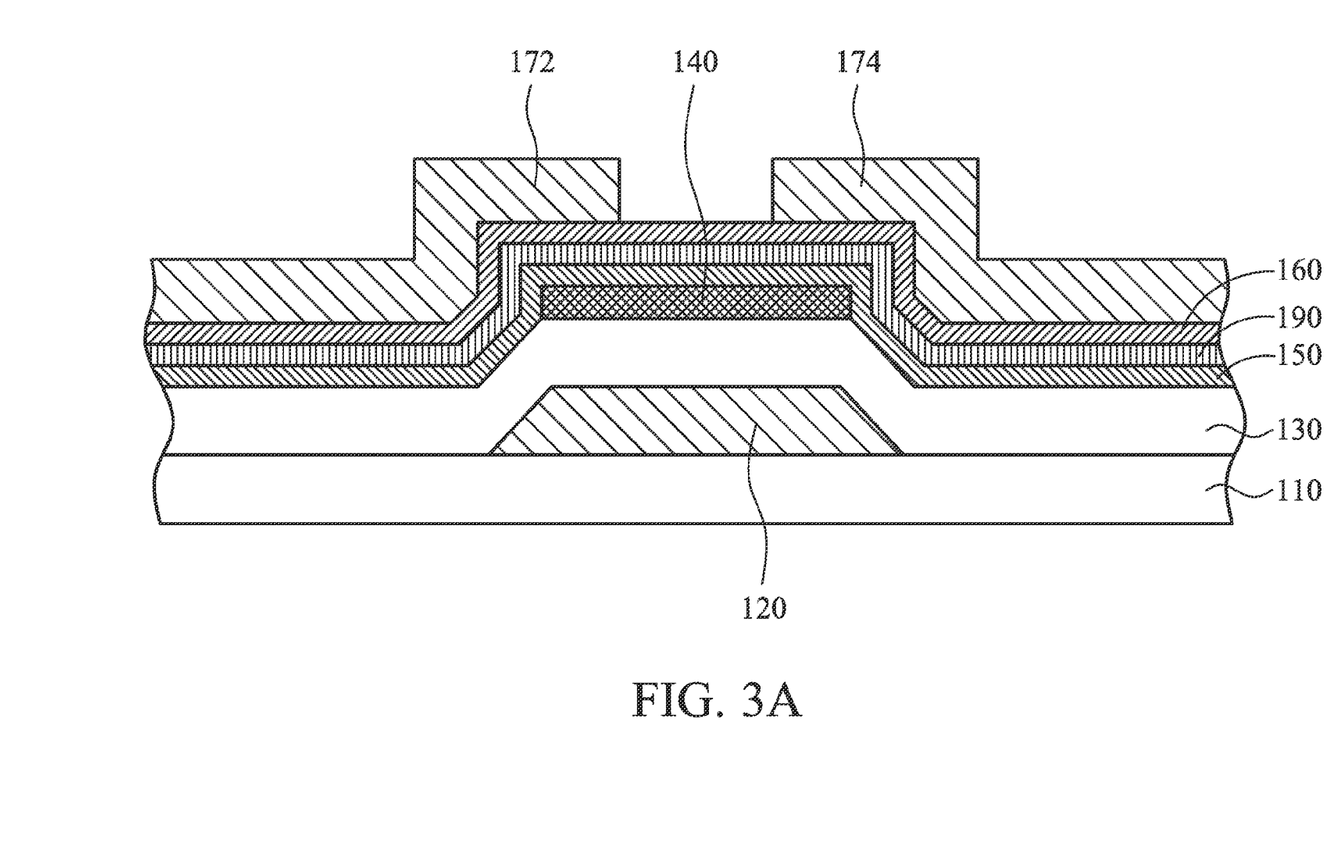
FIGS. 3A-3C are cross-sectional views of a manufacturing process of a thin-film transistor according to another embodiment of the present invention.
Figure 3B:
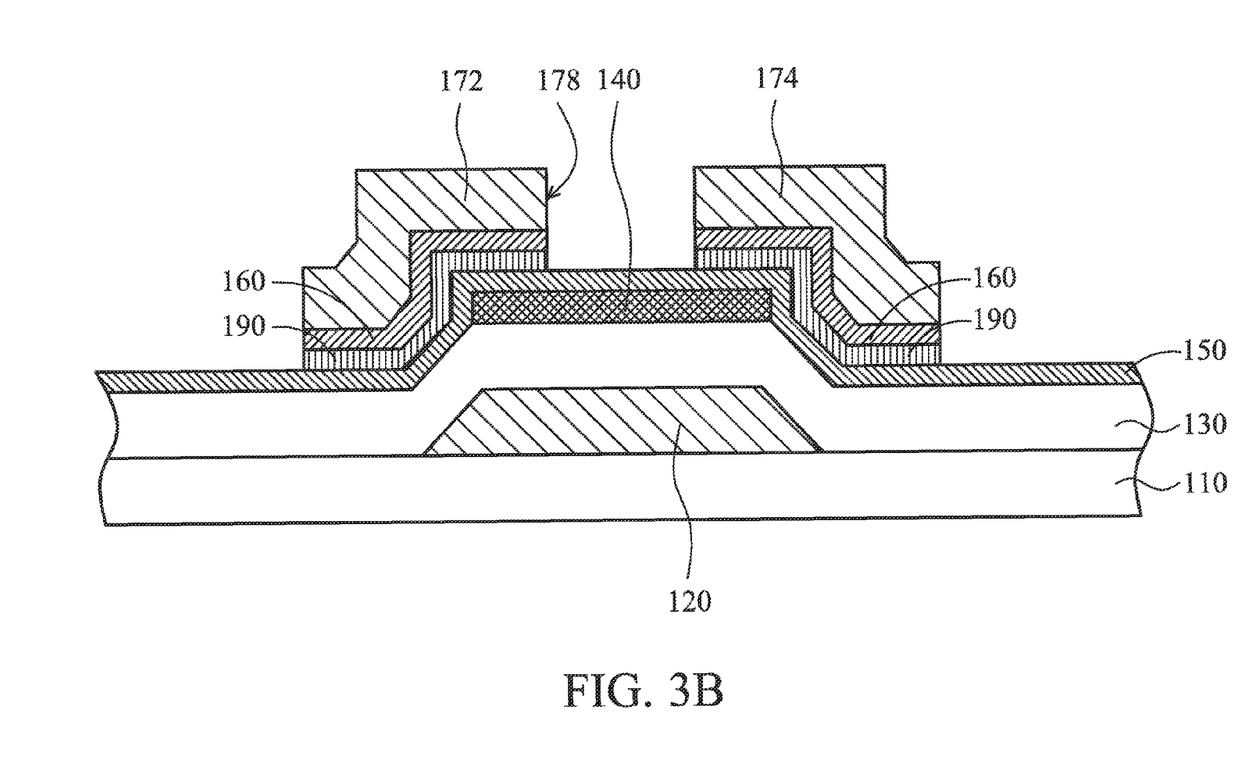
Figure 3C:
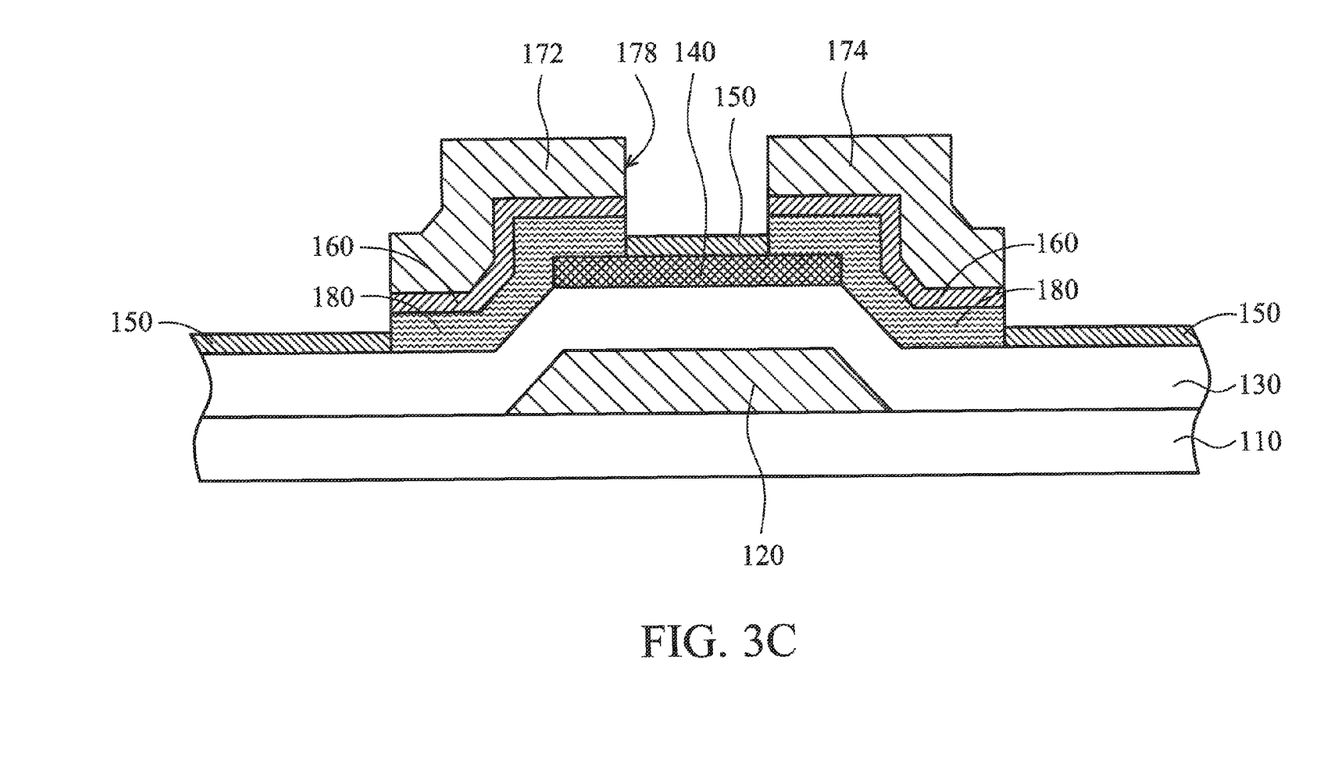

FIGS. 3A-3C are cross-sectional views of a manufacturing process of a thin-film transistor according to another embodiment of the present invention. In another embodiment, referring to FIG. 3A, an interfacial layer 190 may be deposited on the insulating metal oxide layer 150 before forming the metal layer 160. The interfacial layer 190 includes metal oxide material including the first metal and the second metal, and the interfacial layer 190 includes, for example, titanium aluminum oxide ($Ti_{0.2}Al_{0.8}O_X$, TAO, wherein $0.2 \leq X < 1.4$). Then, the metal layer 160, the source electrode 172, and the drain electrode 174 may be formed on the interfacial layer 190.

Referring to FIG. 3B, the metal layer 160 exposed by the trench 178 and the interfacial layer 190 under the trench 178 may be removed. Then, referring to FIG. 3C, an annealing process is performed on the metal layer 160, the interfacial layer 190, and the insulating metal oxide layer 150, such that the metal layer 160, the interfacial layer 190, and the insulating metal oxide layer 150 react with each other to form a conducting composite metal oxide layer 180.

FIGS. 4A-4D are cross-sectional views of a manufacturing process of a thin-film transistor according to another embodiment of the present invention. It should be noted that the elements in the present embodiment, which are labeled identically to those in FIGS. 1A to 1G, have materials, structures, and manufacturing methods that are similar thereto, and therefore the detailed descriptions are not repeated herein.

Figure 4A:
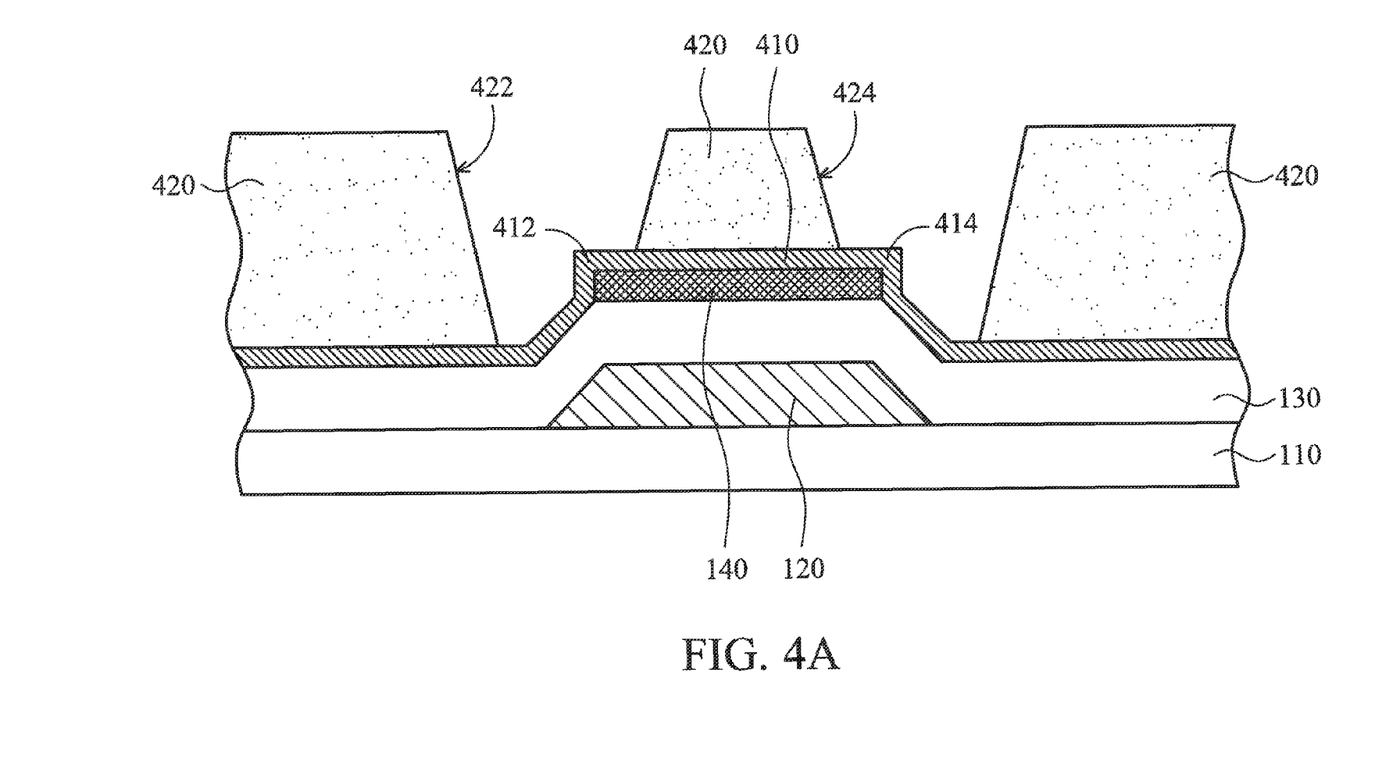
FIGS. 4A-4D is a cross-sectional view of a manufacturing process of a thin-film transistor according to another embodiment of the present invention.

Referring to FIG. 4A, a substrate 110 is provided. Then, a gate electrode 120, a gate insulating layer 130, and an active layer 140 are sequentially formed on the substrate 110 by the method as that depicted in FIG. 1A. Then, an insulating metal oxide layer 410 covering the active layer 140 is formed on the gate insulating layer 130, wherein the insulating metal oxide layer 410 includes a metal oxide material of a metal.

The forming of the insulating metal oxide layer 410 includes, for example, providing oxygen in a metal sputtering process to directly deposit the metal oxide material on the active layer 140. In one embodiment, the metal is copper, molybdenum, or aluminum, and the insulating metal oxide layer 410 is a copper oxide layer, a molybdenum oxide layer, or an aluminum oxide layer.

Then, a mask layer 420 is formed on the insulating metal oxide layer 410, wherein the mask layer 420 has a first opening 422 and a second opening 424, which respectively expose a first portion 412 and a second portion 414 of the insulating metal oxide layer 410. The first portion 412 and the second portion 414 are located above the two opposite sides of the gate electrode 120, respectively. The mask layer 420 includes, for example, photoresist materials or other suitable organic materials.

Figure 4B:
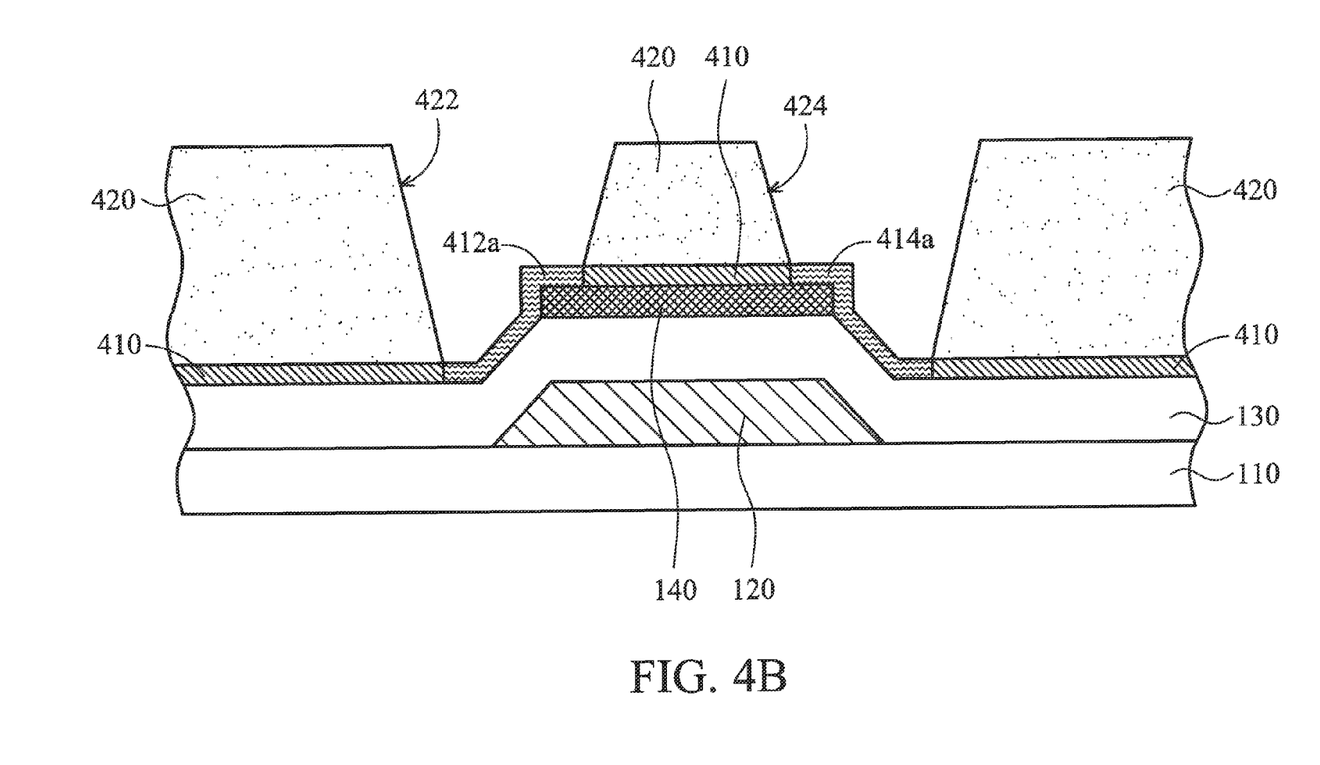

Then, referring to FIG. 4B, an annealing process is performed in a low-pressure environment to reduce the first portion 412 and the second portion 414 to a first conductive portion 412a and a second conductive portion 414a, respectively. The pressure of the low-pressure environment is, for example, less than 100 mTorr (milli-torr). The temperature of the annealing process is, for example, about 100° C. to 400° C.

Specifically, in the present embodiment, the annealing process is used to remove the oxygen molecules of the first portion 412 and the second portion 414 so as to form the first conductive portion 412a and the second conductive portion 414a with higher electrical conductivity, wherein the first conductive portion 412a and the second conductive portion 414a may include a metal or a conductive metal oxide material with an oxygen content less than that of the insulating metal oxide layer 410.

It should be noted that, after the annealing process, only the portion of the insulating metal oxide layer 410 exposed by the mask layer 420 (i.e. the first portion 412 and the second portion 414) can be converted into the first conductive portion 412a and the second conductive portion 414a with electrical conductivity, and the residual portion of the insulating metal oxide layer 410 covered by the mask layer 420 remains insulating properties since the oxygen molecules are not removed. Therefore, the portion of the insulating metal oxide layer 410 remaining insulating properties may separate the first conductive portion 412a from the second conductive portion 414a to electrically insulate the first conductive portion 412a from the second conductive portion 414a.

Figure 4C:
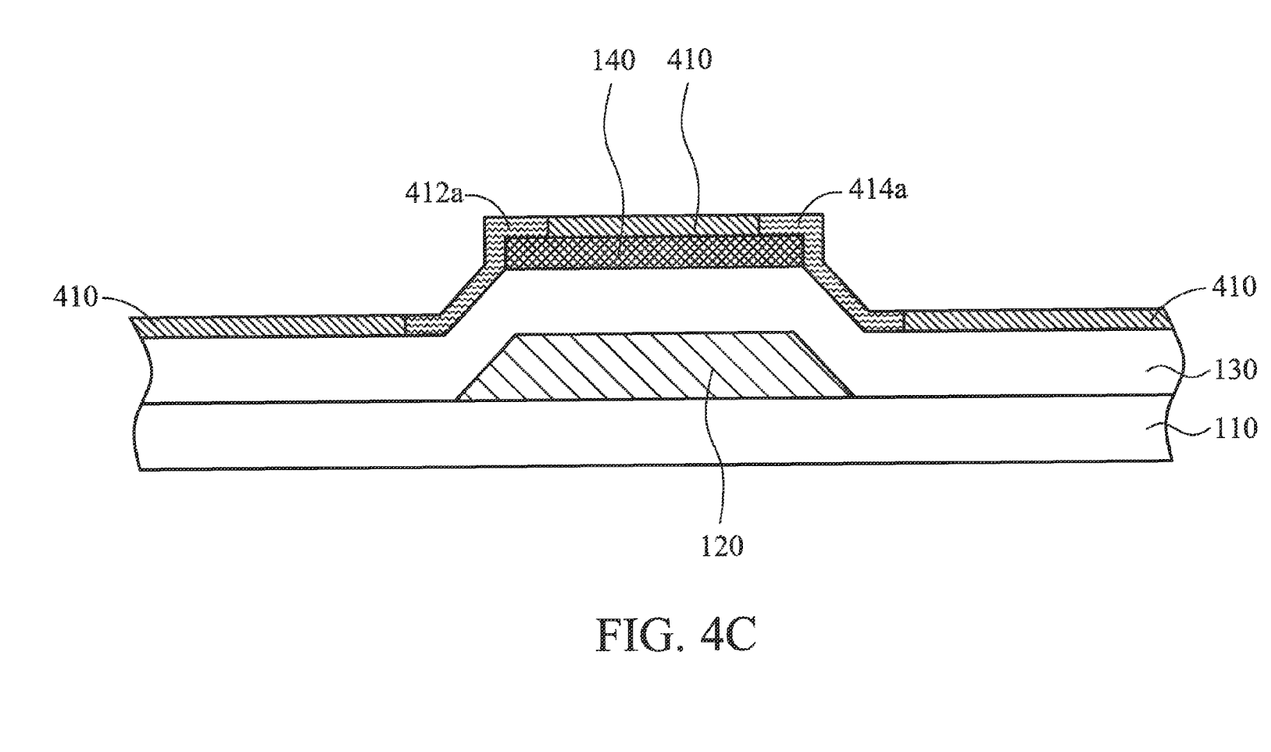

Referring to FIG. 4C, the mask layer 420 is removed. Then, referring to FIG. 4D, a source electrode 172 and a drain electrode 174 are respectively formed on the first conductive portion 412a and the second conductive portion 414a. The forming method of the source electrode 172 and the drain electrode 174 may be similar to that of FIGS. 1A and 1B.

Figure 4D:
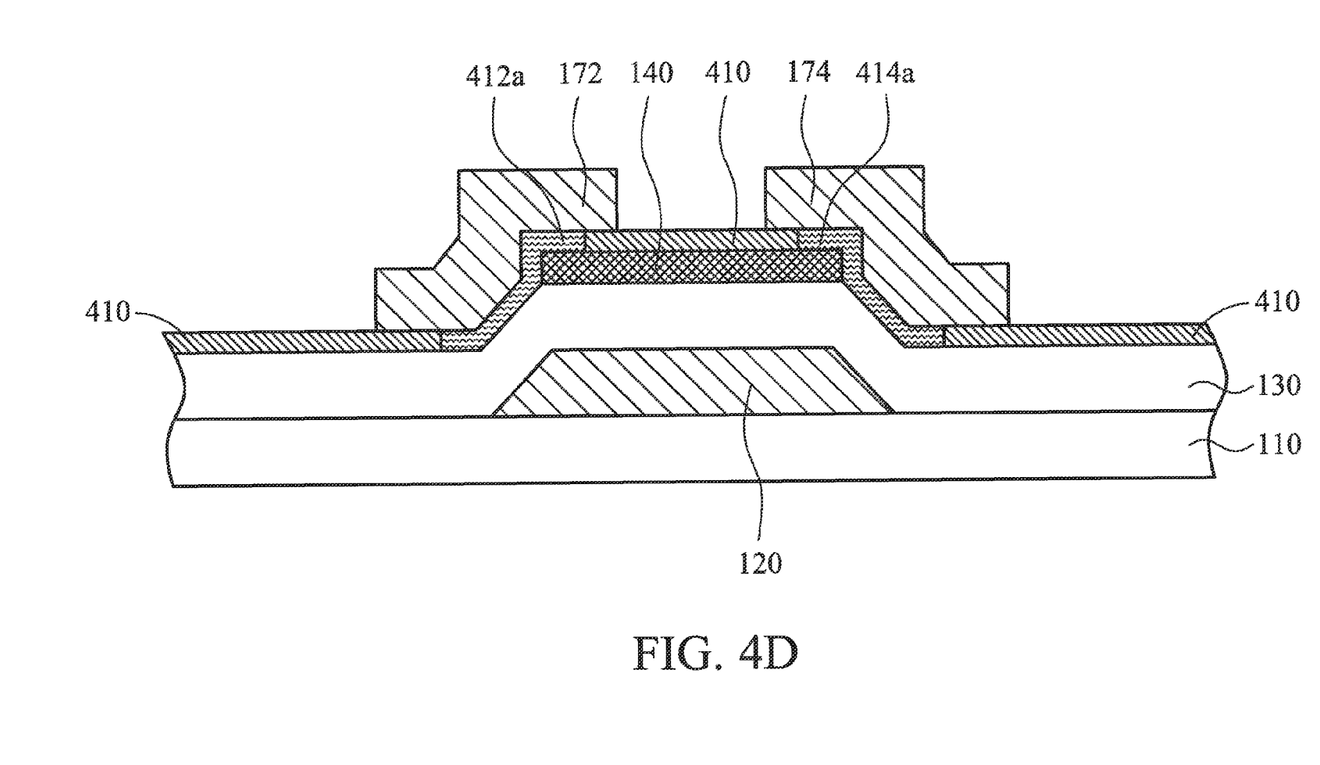

It can be seen from the above that, in the present embodiment, the insulating metal oxide layer 410 is formed on the active layer 140, and the portion of the insulating metal oxide layer 410 designed to connect the source electrode 172 and the drain electrode 174 is reduced to the first conductive portion 412a and the second conductive portion 414a so as to electrically connect the active layer 140 to the source electrode 172 and electrically connect the active layer 140 to the drain electrode 174. After the annealing process, the portion of the insulating metal oxide layer 410 remaining insulating properties may separate the first conductive portion 412a from the second conductive portion 414a, and may be used as a protective layer during the formation of the source electrode 172 and the drain electrode 174.

It should be noted that, although the embodiments described above use the bottom gate thin-film transistor as examples for illustration, the invention is not limited thereto. For example, the thin-film transistor of the invention and the manufacturing method thereof may also be applied on top gate thin-film transistors.

Figure 5:
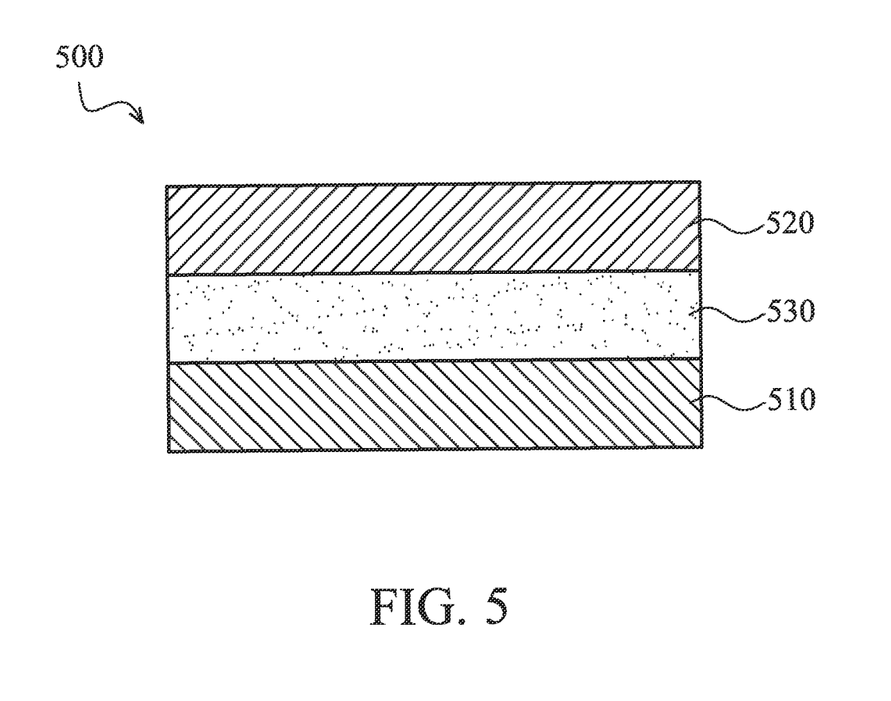
FIG. 5 is a cross-sectional view of a display according to an embodiment of the present invention.

FIG. 5 is a cross-sectional view of a display according to an embodiment of the present invention. Referring to FIG. 5, a display 500 of the present embodiment includes a thin-film transistor substrate 510, a substrate 520, and a display medium 530 sandwiched therebetween. The thin-film transistor substrate 510 may be the thin-film transistor substrate shown in FIG. 1D, 2, 3C, or 4D, and the display medium 530 may be a liquid crystal layer or an organic light-emitting layer. The substrate 520 is, for example, a color filter substrate or a transparent substrate.

In view of the foregoing, in the present invention, the metal layer is used as an etching stop layer during the etching of the separating portion to protect the insulating metal oxide layer and the active layer under the metal layer. The insulating metal oxide layer is used as a protective layer during removal of the metal layer to protect the active layer under the insulating metal oxide layer. Then, by performing the annealing process, the insulating metal oxide layer reacts with the metal layer to form the conducting composite metal oxide layer to electrically connect the active layer to the source electrode and electrically connect the active layer to the drain electrode.

It can be known from the above that, in the present invention, the insulating metal oxide layer is formed on the active layer, and the portion of the insulating metal oxide layer designed to connect the source electrode and the drain electrode is reduced to the first conductive portion and the second conductive portion so as to electrically connect the active layer to the source electrode and electrically connect the active layer to the drain electrode. After the annealing process, the portion of the insulating metal oxide layer remaining insulating properties may separate the first conductive portion from the second conductive portion, and may be used as a protective layer in forming the source electrode and the drain electrode.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of a thin-film transistor, comprising:
    providing a substrate;
    forming a gate electrode and a gate insulating layer covering the gate electrode on the substrate;
    forming an active layer disposed on the gate insulating layer, wherein the active layer is above the gate electrode;
    forming an insulating metal oxide layer covering the active layer disposed on the gate insulating layer, wherein the insulating metal oxide layer comprises a metal oxide material of a first metal;
    forming a metal layer covering the active layer disposed on the insulating metal oxide layer, wherein the metal layer comprises a second metal different from the first metal;
    forming a source electrode and a drain electrode deposed on the metal layer, wherein the source electrode and the drain electrode above the active layer are separated from each other by a trench to be respectively located at two opposite sides of the gate electrode, wherein the trench exposes a portion of the metal layer;
    removing the portion of the metal layer exposed by the trench to expose the insulating metal oxide layer by the trench; and
    performing an annealing process to the metal layer and the insulating metal oxide layer, such that the metal layer reacts with the insulating metal oxide layer overlapping the metal layer to form a conducting composite metal oxide layer comprising the first metal and the second metal, wherein the conducting composite metal oxide layer connects with the active layer and the source electrode, and connects with the active layer and the drain electrode.

2. The manufacturing method of the thin-film transistor as claimed in claim 1, wherein the first metal is aluminum, the insulating metal oxide layer is an aluminum oxide layer, the second metal is titanium, and the conducting composite metal oxide layer is a titanium aluminum oxide layer.

3. The manufacturing method of the thin-film transistor as claimed in claim 1, wherein the forming of the source electrode and the drain electrode comprises:
    forming a protective conducting layer on the metal layer, wherein the protective conducting layer comprises the source electrode, the drain electrode and a separating portion between the source electrode and the drain electrode on the active layer;
    forming a photoresist layer on the protective conducting layer, wherein the photoresist layer covers the source electrode and the drain electrode and exposes the separating portion; and
    performing a wet etching process by using the photoresist layer as a mask to remove the separating portion and expose a portion of the metal layer.

4. The manufacturing method of the thin-film transistor as claimed in claim 1, wherein the removing of the portion of the metal layer exposed by the trench comprises:
    performing a dry etching process by using the source electrode and the drain electrode as a mask.

5. The manufacturing method of the thin-film transistor as claimed in claim 1, wherein before forming the metal layer, the manufacturing method of the thin-film transistor further comprises:
    forming an interfacial layer on the insulating metal oxide layer, wherein the interfacial layer comprises an oxide material of the first metal and the second metal,
    wherein the removing of the portion of the metal layer exposed by the trench further comprises:
    removing the interfacial layer under the trench.

6. A manufacturing method of a thin-film transistor, comprising:
    providing a substrate;
    forming a gate electrode and a gate insulating layer covering the gate electrode on the substrate;
    forming an active layer on the gate insulating layer, wherein the active layer is above the gate electrode;

forming an insulating metal oxide layer covering the active layer on the gate insulating layer, wherein the insulating metal oxide layer comprises a metal oxide material of a first metal;

forming a mask layer on the insulating metal oxide layer, wherein the mask layer has a first opening and a second opening respectively exposing a first portion and a second portion of the insulating metal oxide layer, and the first portion and the second portion are respectively above opposite two sides of the gate electrode;

performing an annealing process to reduce the first portion and the second portion to a first conductive portion and a second conductive portion respectively, wherein the first conductive portion and the second conductive portion comprise a metal or a conductive metal oxide material with an oxygen content less than that of the insulating metal oxide layer;

removing the mask layer; and forming a source electrode and a drain electrode on the first conductive portion and the second conductive portion respectively.

7. The manufacturing method of the thin-film transistor as claimed in claim 6, wherein the performing of the annealing process comprises:

performing the annealing process in a low-pressure environment, wherein the pressure of the low-pressure environment is less than 100 mTorr.

8. The manufacturing method of the thin-film transistor as claimed in claim 6, wherein the temperature of the annealing process is about 100° C. to 400° C.

9. A display device, comprising:

a substrate;

a gate electrode on the substrate;

a gate insulating layer on the substrate and covering the gate electrode;

an active layer on the gate insulating layer and above the gate electrode;

a protective conducting layer on the active layer, wherein the protective conducting layer has a first conductive portion and a second conductive portion on the opposite sides of the gate electrode respectively, a trench separates the first conductive portion from the second conductive portion, and the protective conducting layer is a metal layer comprising a first metal, a metal oxide layer comprising the first metal, or a conducting composite metal oxide layer comprising the first metal and a second metal different from the first metal;

an insulating metal oxide layer on the active layer and in the trench to electrically insulate the first conductive portion from the second conductive portion, wherein the insulating metal oxide layer is a metal oxide layer comprising the first metal; and a source electrode and a drain electrode on the first conductive portion and the second conductive portion respectively.

10. The display device as claimed in claim 9, wherein the insulating metal oxide layer has an oxygen content higher than that of the protective conducting layer.

11. The display device as claimed in claim 9, wherein the conducting composite metal oxide layer comprising the first metal and the second metal is a titanium aluminum oxide layer.

12. The display device as claimed in claim 9, wherein the metal oxide layer comprising the first metal is a copper oxide layer, a molybdenum oxide layer, or an aluminum oxide layer.

13. The display device as claimed in claim 9, wherein the metal layer comprising the first metal is a copper layer, a molybdenum layer, or an aluminum layer.

14. The display device as claimed in claim 9, wherein the first metal is copper, molybdenum, or aluminum, and the insulating metal oxide layer is a copper oxide layer, a molybdenum oxide layer, or an aluminum oxide layer.

15. The display device as claimed in claim 9, wherein the active layer comprises indium-gallium-zinc-oxide.

16. The display device as claimed in claim 9, wherein the protective conducting layer is the conducting composite metal oxide layer comprising the first metal and the second metal, and the thin-film transistor further comprises:

a metal layer between the first conductive portion and the source electrode, and between the second conductive portion and the drain electrode, wherein the metal layer comprises the second metal, wherein lengths of the source electrode and the drain electrode are substantially the same as that of the metal layer corresponding to the source electrode and the drain electrode.

17. The display device as claimed in claim 9, wherein the protective conducting layer is the conducting composite metal oxide layer comprising the first metal and the second metal, the first metal is aluminum, the insulating metal oxide layer is an aluminum oxide layer, the second metal is titanium, and the conducting composite metal oxide layer is a titanium aluminum oxide layer.

18. The display device r as claimed in claim 9, wherein a thickness of the insulating metal oxide layer ranges from about 100 Å to about 300 Å.

19. The display device as claimed in claim 18, wherein the thickness of the insulating metal oxide layer ranges from about 150 Å to about 250 Å.

20. The display device as claimed in claim 9, wherein a length of the active layer is less than that of the gate electrode.

* * * * *